United States Patent [19]

Sweeney

[11] Patent Number: 5,023,485
[45] Date of Patent: Jun. 11, 1991

[54] METHOD AND CIRCUITRY FOR TESTING A PROGRAMMABLE LOGIC DEVICE

[75] Inventor: Frank J. Sweeney, Rowlett, Tex.

[73] Assignee: Texas Instruments Incorporated, Dallas, Tex.

[21] Appl. No.: 445,069

[22] Filed: Dec. 4, 1989

[51] Int. Cl.$^5$ .................................. H03K 19/177
[52] U.S. Cl. .................... 307/465; 307/443; 307/469; 371/22.2
[58] Field of Search ............... 307/443, 465, 468–469; 371/22.2

[56] References Cited

U.S. PATENT DOCUMENTS

| | | | |
|---|---|---|---|
| 4,517,672 | 5/1985 | Pfleiderer et al. | 371/22.2 X |
| 4,625,311 | 11/1986 | Fitzpatrick et al. | 371/22.2 |
| 4,740,919 | 4/1988 | Elmer | 365/104 |
| 4,780,628 | 10/1988 | Illman | 371/22.2 X |
| 4,857,773 | 8/1989 | Takata et al. | 307/465 |
| 4,879,688 | 11/1989 | Turner et al. | 371/22.2 X |

OTHER PUBLICATIONS

"Fault Detection in PLAs", Righbati, Simon Fraser University, IEEE Design & Test, Dec. 1986, pp. 43–49.
"Implementing a Built-In Self-Test PLA Design", Treuer et al., McGill University, IEEE Design & Test, Apr., 1985, pp. 37–48.
Cypress Semiconductor AAL C22V10 Specification Sheet.

Primary Examiner—David Hudspeth
Attorney, Agent, or Firm—B. Peter Barndt; James T. Comfort; Melvin Sharp

[57] ABSTRACT

A test configuration register (80) associated with a programmable memory device (88), wherein the signals at the outputs of the test configuration register force elements of the memory device into certain logic states to enable the device to be tested without programmning the device's logic array (22).

39 Claims, 3 Drawing Sheets

METHOD AND CIRCUITRY FOR TESTING A PROGRAMMABLE LOGIC DEVICE

TECHNICAL FIELD OF THE INVENTION

This invention relates in general to the field of integrated circuits, and more particularly to circuitry and method for testing programmable logic devices.

BACKGROUND OF THE INVENTION

As programmable logic becomes more generic and versatile, the means for testing the product prior to shipment needs to become more versatile. Programmable array logic (PAL) devices are programmed by the customer. However, prior to shipment it is necessary to verify the AC/DC/functional performance of the device. Because a PAL is non-functional if not programmed, it is necessary to add special test features to assure that the customer receives only products meeting certain specifications.

Previous test circuit methodologies provided only limited ability to test specific features of PAL devices. The test features were fixed and limited and if the need arose for more creative or comprehensive testing, the test could not be performed without a design change. In addition, previous test circuits would not always use the same circuitry as used by the customer.

Past efforts to add testability to PAL devices have included the use of extra input lines and extra product terms under specific input conditions. The extra input lines are sensed through the "AND" array and the extra product terms are multiplexed into the "OR" gate. These features have allowed for verification of programming circuitry for every input line and product term as well as determining the functionality of the SUM-OF-PRODUCTS term for every product term. These features have also been used to test the AC performance of the device.

There are several disadvantages to this method of testing. All input and feedback buffers are not fully testable. This type of test does not always provide a good correlation with actual device performance and does not test all possible outputs or output configurations. The paths used for the test are not the actual operational device paths that are to be guaranteed to the customer. Thus, the problem of correlating results to the internal circuit delays becomes an issue and can cause "slow" devices to be incorrectly approved. Furthermore, the asynchronous reset and synchronous preset functions are not fully tested, if they are tested at all.

Another method for testing the performance of an unprogrammed PAL device uses a special setup condition which will disable certain device features and force certain device conditions. This technique is used on the TICPAL16XX devices manufactured by Texas Instruments Inc. Under a special setup condition, the device enters a test mode. In the test mode, all false input buffers and the true and false feedback buffers are forced into a disabled state where it will appear logically as if the programmable cells the buffers address are all programmed. For outputs in a non-register configuration, one-half of the outputs will have the SUM-OF-PRODUCTS term forced to a logical "1" condition and the OUTPUT-ENABLE product term will be available for test. The other half will have the OUTPUT-ENABLE product term forced to a logical "1" condition and the SUM-OF-PRODUCTS term will be available for test. For outputs in the registered configuration, there is no OUTPUT-ENABLE product term; thus the SUM-OF-PRODUCTS term is always available for test in the test mode.

Disadvantages to this approach include:
1) Only true input buffers can be tested.
2) Only certain tests can be performed on each non-registered output. One-half of the outputs can do only $T_{plh}$ and $T_{phl}$, the other half can do only $T_{plz}$ and $T_{pzl}$. Thus, $T_{phz}$ and $T_{pzh}$ cannot be done.
3) Practice has shown this methodology to have little or no correlation to actual device performance which may be several nanoseconds slower than test results would imply.

Therefore, a need has arisen for PAL circuitry which can test the functions of a PAL device as if the device were in actual service.

SUMMARY OF THE INVENTION

In accordance with the present invention, circuitry is provided which substantially eliminates or reduces disadvantages and problems associated with prior PAL testing circuitry.

Circuitry for testing the functions of programmable logic device is provided. Specifically, a register to store an output test bits is provided as is circuitry for forcing elements of the logic device into predetermined logic conditions responsive to the test bits.

Thus, the present invention has the technical advantage of permitting a programmable logic device to be fully tested without programming the device.

BRIEF DESCRIPTION OF THE DRAWINGS

A more complete understanding of the present invention may be derived by referring to the detailed description and claims when considered in connection with the accompanying drawings, in which like reference numbers indicate like features through the drawings, and wherein:

DETAILED DESCRIPTION OF THE INVENTION

The preferred embodiment of the present invention is best understood by referring to FIGS. 1-4 of the drawings and the Table which follows the description herein, like numerals being used for like and corresponding parts of the various drawings.

Figure 1:
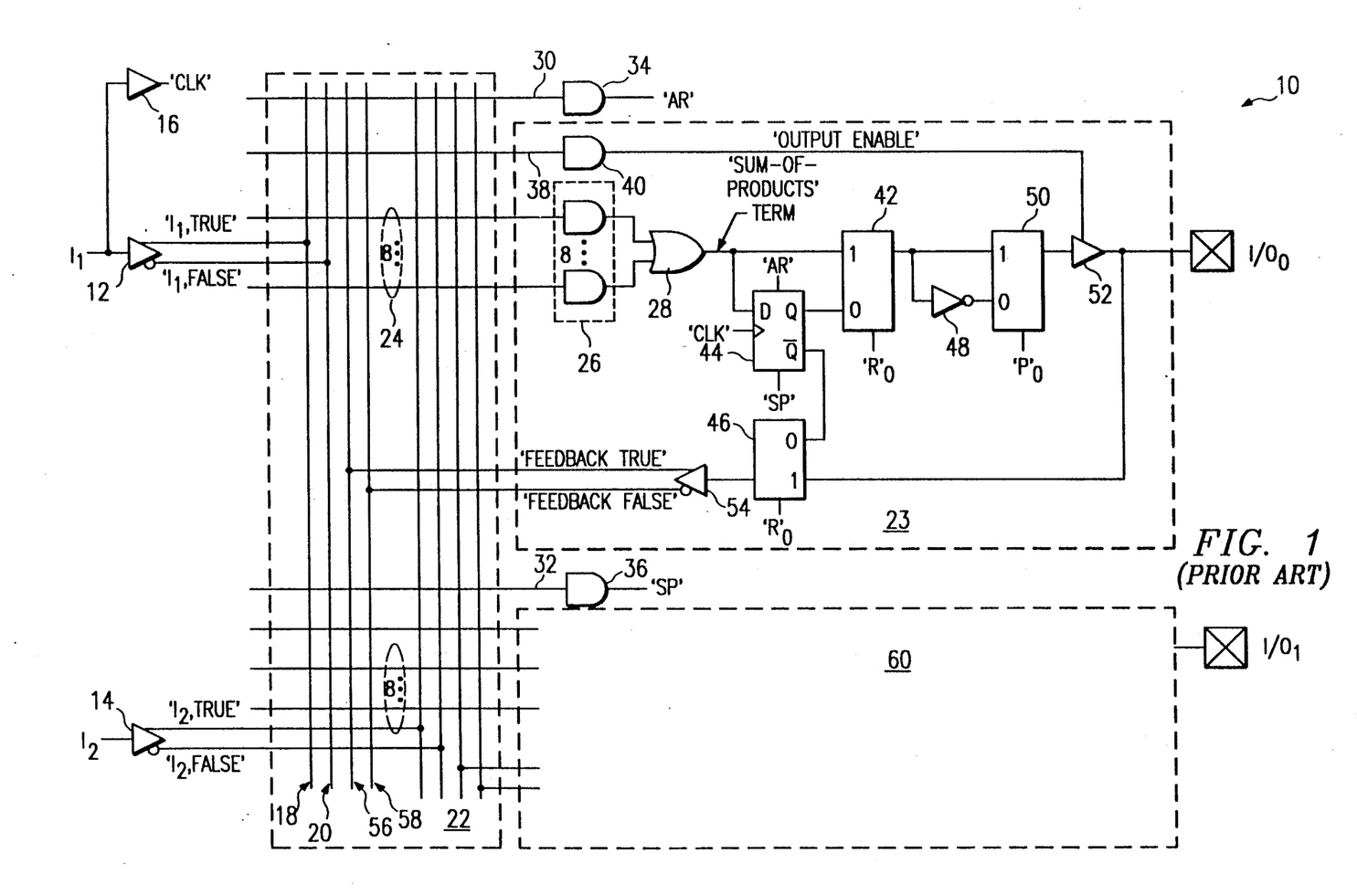
FIG. 1 illustrates a schematic representation of a prior art programmable array logic (PAL) device.

FIG. 1 illustrates a schematic representation of a prior art PAL circuit, generally referred to by reference numeral 10. Although the PAL 10 represented in the FIGUREs and described herein contains four input and two output nodes (herein referred to as a 4V2 PAL designation), the concept of the prior art and of the present invention can be applied to a PAL with any number of input and output nodes. Input signals $I_1$ and $I_2$ are applied to the PAL 10 through input buffers, indicated generally at 12 and 14, respectively. Except where otherwise noted, circuitry associated with one input or output is duplicated at each other input and output.

$I_1$ is also buffered by a buffer 16 and is also used as a timing signal CLK. The input buffer 12 produces two output signals, $I_1$ TRUE and $I_1$ FALSE, which are applied to two input lines 18 and 20 of the logic array 22.

In the 4V2 PAL 10 illustrated, input signal $I_1$ has associated with it an output macrocell 23. The signals on eight product lines, indicated generally at 24, represent the ANDing, indicated by the AND gates at 26 of the input signals. The ANDed signals are then OR'd by an OR gate 28 to produce a SUM-OF-PRODUCTS term at the output node of the OR gate 28. Similarly, the signals on product lines 30 and 32 are ANDed, represented by the AND gates 34 and 36, respectively, to produce signals ASYNCHRONOUS RESET ('AR') and SYNCHRONOUS PRESET ('SP'), respectively. The signal on product line 38 is ANDed, represented by AND gate 40, to produce signal OUTPUT-ENABLE.

The SUM-OF-PRODUCTS term is sent into one input of the register multiplexer (MUX) 42 and into the input of a D flip-flop 44. The non-inverting output of flip-flop 44 is coupled to the second input of register MUX 42; the inverting output of flip-flop 44 is coupled to one input of the feedback multiplexer (MUX) 46.

The output of register MUX 42 is inverted by an inverter 48. The output of MUX 42 and inverter 48 are coupled to the two inputs, respectively, of the polarity MUX 50. The output of the polarity MUX 50 is coupled to the input of the output buffer 52 which is controlled by signal OUTPUT-ENABLE. The output of output buffer 52 forms input/output node $I/O_0$ and is also fed back into the second input of feedback MUX 46. The output of feedback MUX 46 is buffered by a feedback buffer 54 and the resulting FEEDBACK TRUE and FEEDBACK FALSE signals are coupled to input lines 56 and 58, respectively, of the logic array 22.

When signal $P_0$ is a logical "1" and applied to polarity MUX 50, the output $I/O_0$ is active high; when signal $P_0$ is a logical "0", the output $I/O_0$ is active low.

When signal $R_0$ is a logical "1" and applied to register MUX 42 and feedback MUX 46, the output $I/O_0$ is combinatorial and the feedback comes from $I/O_0$. When signal $R_0$ is a logical "0", the output $I/O_0$ is under register control and the feedback comes from the register.

The output macrocell 60 for input/output node $I/O_1$ comprises the same circuitry as for input/output node $I/O_0$.

To better understand the use of the programmable test feature of the present invention, an understanding of the PAL 10 is necessary. The principal features of the PAL 10 are: 1) normal true and false paths of the input and feedback buffers 12 and 54; 2) an input pin ($I_1$) that doubles as a clock pin CLK; 3) asynchronous reset and synchronous preset product terms, AR and SP, (functional only when the output is in register configuration); 4) "AND-OR" logic 26 and 28 providing a SUM-OF-PRODUCTS function and with a programmable OUTPUT-ENABLE product term; and 5) individually configurable outputs $I/O_0$ and $I/O_1$ determined by two control signals: P determines output polarity ("0"=active low, "1"=active high) and R determines registered or combinatorial outputs ("0"=registered outputs, "1"=combinatorial outputs).

The EPROM/FAMOS cells (not shown), located at the intersections of input lines and product lines of the logic array 22, function like normal N-channel FETs when in the erased state. Thus, when the gate of a cell is addressed (logical "1"), the device is "on" and the drain of the cell is a logical "0". Similarly, if the gate of the cell is not addressed (logical "0"), the FET is not conducting and the drain of the cell is a logical "1". Whenever a cell is programmed, the threshold voltage of the cell is shifted to a super high level, such that the FET will never turn-on under normal operation and the drain of the cell will always be a logical "1".

In the PAL logic array 22, the gates of the cells are tied to the input lines, such as input lines 18, 20, 56, and 58, and the drains of the cells are tied to the product lines, such as 24, 30 and 38.

Logically, the FAMOS cell acts as an inverter of the input data to the product term. Additionally, because the drains of the FAMOS cells are tied together, a logical "0" at the drain of any cell will predominate over any number of logical "1"s. This is the AND function represented by AND gates 26, 34, 36 and 40. Thus, the result is the ANDing of inverted input data. The desired result of ANDing the input data is achieved by inverting the data coming out of the input buffer 12 (i.e., when a logical "0" is sensed on the input, the output of the false buffer will be a logical "0" and the output of the true buffer will be a logical "1". If a logical "1" is sensed on the input, the output of the false buffer will be a logical "1" and the output of the true buffer will be a logical "0".)

The SUM-OF-PRODUCTS term, OUTPUT-ENABLE product term, ASYNCHRONOUS RESET product term, SYNCHRONOUS PRESET product term, architecture bits P and R, and the signal CLK are the inputs to the output macrocell 23.

The D flip-flop 44 is a master/slave flip-flop. Whenever the signal CLK is low (logical "0"), the slave data is latched and data passes from the SUM-OF-PRODUCTS into the master part of the flip-flop 44. When the signal CLK goes high, the data from the SUM-OF-PRODUCTS term is latched in the master and passes from the master to the slave. Whenever the asynchronous reset signal AR becomes a logical "1", the slave latch immediately resets to a logical "0". Whenever the synchronous preset signal SP is a logical "1" prior to the edge of signal CLK, the master latch is preset as if the SUM-OF-PRODUCTS term was a logical "1", regardless of its actual state.

The OUTPUT-ENABLE product term 38 controls the output buffer 52. When the signal OUTPUT-ENABLE is a logical "1", the buffer is enabled; when the signal is logical "0", buffer 52 is in tri-state.

The architecture signals P and R are the select inputs for the three output multiplexers 42, 46 and 50. When signal P is a logical "0", the output is active low; when it is a logical "1", the output is active high. When the signal R is a logical "0", the output is under the control of flip-flop 44 and the feedback also comes from the flip-flop. When it is a logical "1", the output is combinatorial with I/O feedback.

Figure 2:
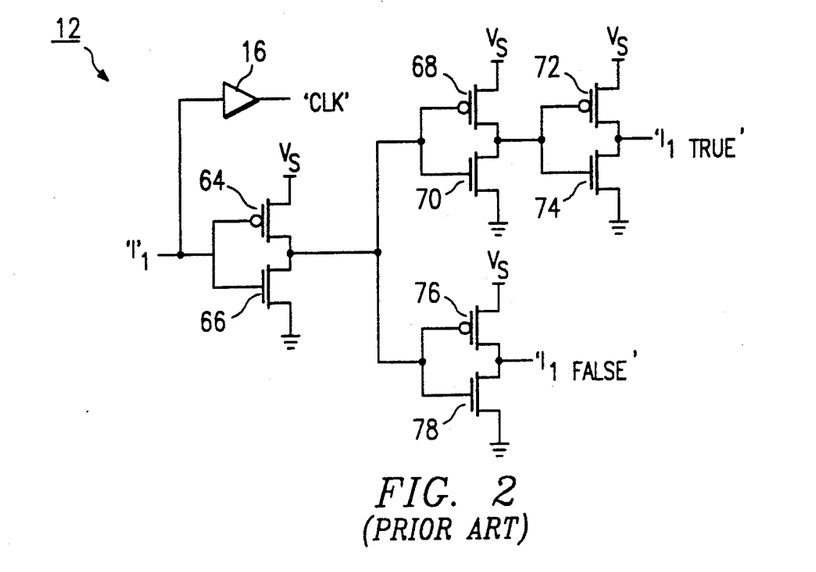
FIG. 2 illustrates a schematic representation of an input buffer of a prior art PAL device.

FIG. 2 illustrates a schematic representation of the details of an input buffer 12 of the prior art PAL 10. The input signal $I_1$ is sent into the gates of a P-channel FET 64 and an N-channel FET 66. The drain of P-channel FET 64 and the drain of N-channel FET 66 are coupled to each other and to the gates of a second FET pair 68 and 70. The drain of the second P-channel FET 68 and the drain of the second N-channel FET 70 are coupled to each other and to the gates of a third FET pair 72 and 74. The drain of the third P-channel FET 72 and the drain of the third N-channel FET 74 are coupled to each other and the resulting node, coupled to product line 18, produces the $I_1$ TRUE signal of input buffer 12.

The node at which the drain of P-channel FET 64 and the drain of N-channel FET 66 are coupled to each other is also coupled to the gates of a fourth FET pair 76 and 78. The drain of the fourth P-channel FET 76 and the drain of the fourth N-channel FET 78 are coupled to each other and the resulting node, coupled to product line 20, produces the $I_1$ FALSE signal of input buffer 12.

The sources of the P-channel FETs 64, 68, 72 and 76 are coupled to a voltage source $V_S$. The sources of the N-channel FETs 66, 70, 74, and 78 are coupled to ground.

Figure 3:
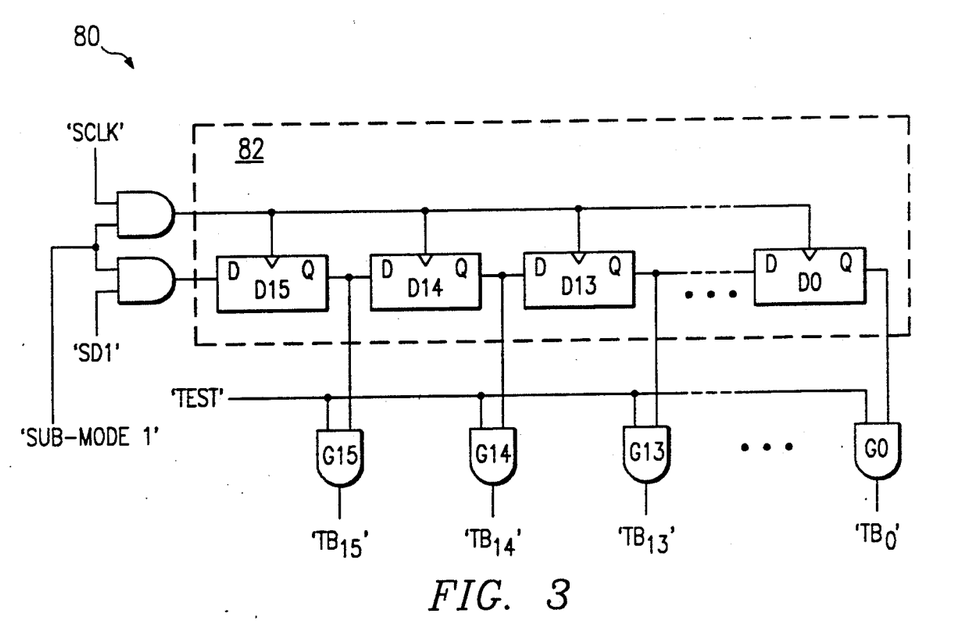
FIG. 3 illustrates a schematic representation of the test configuration register circuitry of the present invention.

FIG. 3 illustrates a schematic representation of the test configuration register circuitry of the present invention, indicated generally at 80. In the preferred embodiment, test configuration register 82 comprises one D flip-flop for each test signal desired; FIG. 3 illustrates the use of 16 test signals, $TB_0$–$TB_{15}$, with 16 flip-flops, $D_0$–$D_{15}$. During a product test, shift-clock signal SCLK is gated with enable signal SUB-MODE1 and applied to the clock inputs of flip-flops $D_0$–$D_{15}$. Serial data signal SD1 is also gated with signal SUB-MODE1 and applied to the input of flip-flop $D_{15}$. The data bits are entered serially and shifted until register 82 is full. Signal SUB-MODE1 then disables the register 82 and the data is protected.

To start a test, the outputs of flip-flops $D_0$–$D_{15}$ are gated through AND gates $G_0$–$G_{15}$ with a signal TEST. The resultant signals, $TB_0$–$TB_{15}$, are applied to elements of the logic device under test to force the desired logic configuration.

Figure 4:
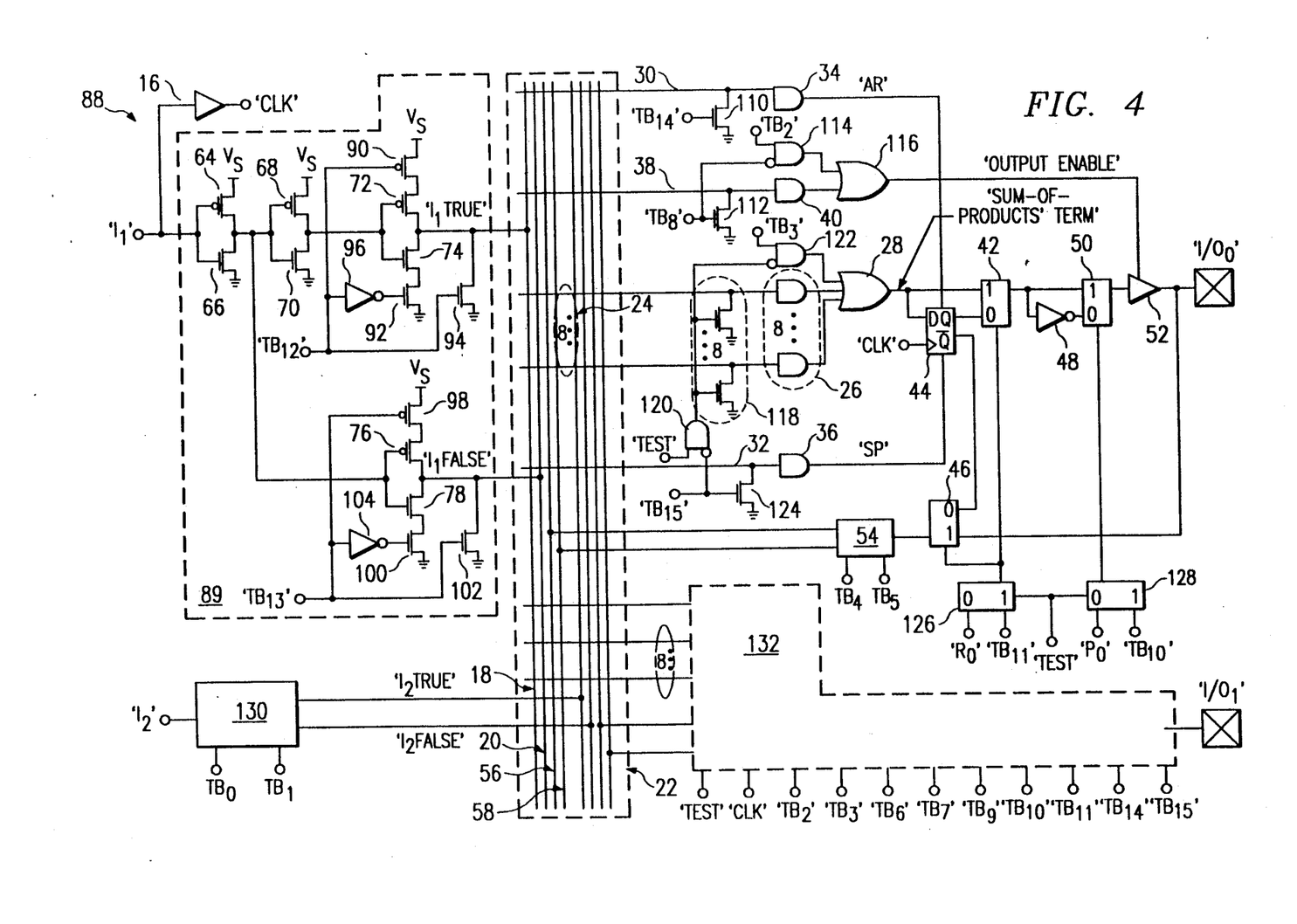
FIG. 4 illustrates a schematic representation of a PAL device using the testing circuitry of the present invention.

FIG. 4 illustrates a schematic representation of PAL with the circuitry of the present invention, indicated generally at 88. As in the prior art buffer 12, the input buffer 89 of the present invention comprises P-channel FETs 64, 68, 72, and 76 and N-channel FETs 66, 70, 74, and 78. Signals $I_1$ TRUE and $I_1$ FALSE are applied to input lines 18 and 20, respectively, of logic array 22.

The TRUE portion of input buffer 89 further comprises P-channel FET 90, N-channel FETs 92 and 94, and inverter 96. The FALSE portion of input buffer 89 further comprises P-channel FET 98, N-channel FETs 100 and 102, and inverter 104.

Signal $TB_{12}$ is applied to the gates of FETs 90 and 94 and to inverter 96. The drain of FET 90 is coupled to the source of FET 72, the drain of FET 92 is coupled to the source of FET 74, and the output of inverter 96 is coupled to the gate of FET 92. The drain of FET 94 is coupled to the node at which signal $I_1$ TRUE is produced.

Similarly, a signal $TB_{13}$ is applied to the gates of FETs 98 and 102 and to inverter 104. The drain of FET 98 is coupled to the source of FET 76, the drain of FET 100 is coupled to the source of FET 78, and the output of inverter 104 is coupled to the gate of FET 100. The drain of FET 102 is coupled to the node at which signal $I_1$ FALSE is produced.

The sources of P-channel FETs 90 and 98 are coupled to a voltage source $V_S$, and the sources of N-channel FETs 92, 94, 100 and 102 are coupled to ground.

In the output of macrocell of the present invention, the representative AND gates 26, 34, 36 and 40 coupled to the product lines 24, 30, 32, and 38 of the logic array 22 are coupled to N-channel FETs to enable and disable the product lines. The drain of FET 110 is coupled to the product line 30, the output of which produces the signal AR. The gate of FET 110 receives test bit $TB_{14}$ from register 82, and the source is coupled to ground.

The drain of FET 112 is coupled to the product line 38, associated with signal OUTPUT-ENABLE. The gate of FET 112 receives test bit $TB_8$ and the source is coupled to ground. Test bit $TB_8$ is also sent to the inverting input of AND gate 114. The non-inverting input of AND gate 114 receives test bit $TB_2$. The outputs of AND gates 40 and 114 are coupled to the inputs of OR gate 116, the output of which produces signal OUTPUT-ENABLE.

The drain of each FET 118 is coupled to a product line 24. Each gate is coupled to the output of AND gate 120, and each source is coupled to ground. The output of AND gate 120 is also coupled to the inverting input of AND gate 122. The non-inverting input of AND gate 122 receives test bit $TB_3$ and the output of AND gate 122 is coupled to an input of OR gate 28.

The non-inverting input of AND gate 120 receives test enable signal TEST and the inverting input receives test bit $TB_{15}$.

Test bit $TB_{15}$ is also received at the gate of FET 124. The drain of FET 124 is coupled to product line 32, which produces signal SP. The source of FET 124 is coupled to ground.

MUX 126 is controlled by test enable signal TEST; one input receives register/combinatorial signal R and the other receives the test bit $TB_{11}$. Similarly, MUX 128 is controlled by TEST; one input receives polarity signal P and the other receives test bit $TB_{10}$.

The input buffers associated with input $I_2$ and the product lines associated with output $I/O_1$ are coupled to similar controlling circuitry shown generally in FIG. 4 as reference numerals 130 and 132, respectively. Test bits $TB_0$ and $TB_1$ are received by input buffer 130. Signals CLK and TEST and test bits $TB_2$, $TB_3$, $TB_6$, $TB_7$, $TB_9$, $TB_{10}$, $TB_{11}$, $TB_{14}$, and $TB_{15}$ are received by output circuitry 132.

In operation, under special test conditions the PAL device has certain elements properly forced to a certain logical conditions; then the unforced elements and their related functional paths can be tested for both functionality and AC/DC performance. Potential elements for forcing to specific conditions are:

1. Force the input and feedback true and false buffers to a logical "0" state. This will cause all FAMOS cells tied to the input lines that the buffers represent to appear as programmed to the product term "AND" gate. This will allow for toggling of the SUM-OF-PRODUCTS term, the OUTPUT-ENABLE, AR and SP product terms.
2. Force all OUTPUT-ENABLE product terms to a logical "1" state. By adding this forcing function, $T_{pd}$ can be tested without an output in tri-state conflicting with the result.
3. Force all SUM-OF-PRODUCTS terms to a logical "1" state. By adding this forcing function, $T_{en}/T_{dis}$ can be tested without the SUM-OF-PRODUCTS term conflicting with result.
4. Force the configuration of output macrocells 23 and 132. This allows for testing of all configurations of the output. Thus, $T_{pd}$ and $T_{su}$ can be tested for the output without actually programming the logic array 22 for the different configurations for the test.

5. Force the AR and SP functions to logical "0" state. By adding these configurations, the AR and SP functions can be tested. $T_{su}$ can also be tested without conflict being created by the product terms. Whenever the SP product term is not forced to a logical "0" state, it is assumed that this function is to be tested. Thus, the SUM-OF-PRODUCTS term needs to be forced to a logical "0" state, overriding the forcing function of No. 3 above.
6. Force the OUTPUT-ENABLE product term to logical "0" state. There should be two separately available forcing functions breaking the outputs into two groups. Additionally, these functions need to override the forcing function for No. 2 above, for their respective outputs. This will allow for I/O feedback testing between the two groups.

TABLE 1 below illustrates the functions of the test bits of one embodiment of the invention. Except with respect to test bits $TB_{10}$ and $TB_{11}$, a logical "0" on a test bit results in normal operation. A logical "1" turns on the FET to which the test bit is sent, thereby grounding the input and disabling the element to which the FET is coupled. By properly inputting data into the test configuration register 82, the test engineer can test device speed parameters, such as:

1. $T_{pd}$ from every I (true and false paths) to every I/O. $T_{pd}$ from every I/O (true and false paths) to other I/O's (for both polarities).
2. $T_{co}$ for every output (for both polarities).
3. $T_{su}$ from every I (true and false paths) to every I/O. $T_{su}$ from every I/O (true and false paths) to other I/O's (for both polarities).
4. $T_{en}$ and $T_{dis}$ from every I (true and false paths) to every I/O. $T_{en}$ and $T_{dis}$, from every I/O (true and false paths) to other I/O's (for both polarities).
5. $T_{pd}$ asynchronous reset from every I (true and false paths) to every I/O (for both polarities).
6. $T_{su}$ synchronous preset from every I (true and false paths) to every I/O.

A non-exhaustive summary of some of the available tests is now given by way of example:

To test $T_{en}/T_{dis}$ from input true path to I/O, the test configuration register is loaded as follows:

| BIT | VALUE | FUNCTION |
|-----|-------|----------|
| 0 | "0" | Enable true input path buffer ($I_2$) |
| 1 | "1" | Force false input path to logical one ($I_2$) |
| 2 | "0" | Normal operation for output enable product terms |
| 3 | "1" | Force SUM-OF-PRODUCT terms to logical one (SYNCHRONOUS PRESET will be disabled) |
| 4 | "1" | Force true feedback path to logical one ($I/O_0$) |
| 5 | "1" | Force false feedback path to logical one ($I/O_0$) |
| 6 | "1" | Force true feedback path to logical one ($I/O_1$) |
| 7 | "1" | Force false feedback path to logical one ($I/O_1$) |
| 8 | "0" | Do not disable output (i.e., allow normal output operation) ($I/O_0$) |
| 9 | "0" | Do not disable output (i.e., allow normal output operation) ($I/O_0$) |
| 10 | X | Both polarities need to be tested |
| 11 | "1" | Combinational outputs for $T_{en}/T_{dis}$ measurement |
| 12 | "0" | Enable $I_1$ true path buffer |
| 13 | "1" | Force false path $I_1$ to logical one |
| 14 | X | ASYNCHRONOUS RESET valid only in register configuration |
| 15 | "1" | Force SYNCHRONOUS PRESET product term to logical zero |

In this configuration, after forcing each input except the input to be tested to a logical one, pulsing the input under test (either $I_1$ or $I_2$) will cause all of the outputs to be enabled (input="1") and disabled (input="0"). By changing the polarity bit, $T_{pzh}$, $T_{phz}$, $T_{pzl}$ and $T_{plz}$ can be measured. Therefore, $T_{en}/T_{dis}$ can be tested from every input true path to every I/O. Likewise, the false paths may be tested by inverting bits $TB_0$, $TB_1$, $TB_{12}$ and $TB_{13}$.

To test $T_{en}/T_{dis}$ from an I/O true path to an I/O, the configuration test register is loaded as follows:

| BIT | VALUE | FUNCTION |
|-----|-------|----------|
| 0 | "1" | Force true input path to logical one ($I_2$) |
| 1 | "1" | Force false input path to logical one ($I_2$) |
| 2 | "0" | Normal operation for output enable product terms (will be overridden by $TB_8$ for output $I/O_0$) |
| 3 | "1" | Force SUM-OF-PRODUCT terms to logical one (SYNCHRONOUS PRESET will be disabled) |
| 4 | "0" | Enable true feedback path ($I/O_2$) |
| 5 | "1" | Force false feedback path to logical one ($I/O_0$) |
| 6 | "1" | Force true feedback path to logical one ($I/O_1$) |

-continued

| BIT | VALUE | FUNCTION |
|---|---|---|
| 7 | "1" | Force false feedback path to logical one (I/O$_1$) |
| 8 | "1" | Disable output (I/O$_0$) |
| 9 | "0" | Do not disable output (I/O$_1$) |
| 10 | X | Both polarities need to be tested |
| 11 | "1" | Combinatorial outputs for T$_{en}$/T$_{dis}$ measurement |
| 12 | "1" | Force true path I$_1$ to logical one |
| 13 | "1" | Force false path I$_1$ to logical one |
| 14 | X | ASYNCHRONOUS RESET valid only in register configuration |
| 15 | "1" | Force SYNCHRONOUS PRESET product term to logical zero |

In this configuration, after forcing I/O$_1$ to a logical "1" or "0", pulsing the input under test (I/O$_0$) causes the output (I/O$_1$) to be enabled (input="1") and disabled (input="0"). By changing the polarity bit P, T$_{pzh}$, T$_{phz}$, T$_{pzl}$ and T$_{plz}$ can be measured.

To test T$_{pd}$ ASYNCHRONOUS RESET from an input true path to an I/O, the test configuration register is loaded as follows:

| BIT | VALUE | FUNCTION |
|---|---|---|
| 0 | "0" | Enable true input path buffer (I$_2$) |
| 1 | "1" | Force false input path to logical one (I$_2$) |
| 2 | "1" | Force output enable product terms to logical one |
| 3 | "1" | Force SUM-OF-PRODUCT terms to a logical one (SP will be disabled) |
| 4 | "1" | Force true feedback path to logical one (I/O$_0$) |
| 5 | "1" | Force false feedback path to logical one (I/O$_0$) |
| 6 | "1" | Force true feedback path to logical one (I/O$_1$) |
| 7 | "1" | Force false feedback path to logical one (I/O$_1$) |
| 8 | "0" | Do not disable output (i.e., allow normal output operation) (I/O$_0$) |
| 9 | "0" | Do not disable ouput (i.e., allow normal output operation) (I/O$_1$) |
| 10 | X | Both polarities need to be tested |
| 11 | "0" | Registered outputs for T$_{pd}$ AR measurement |
| 12 | "0" | Enable I$_1$ true path for T$_{pd}$ |
| 13 | "1" | Force false path I$_1$ to logical one |
| 14 | "0" | Enable AR product term |
| 15 | "1" | Force SP product term to logical zero |

In this configuration, forcing all inputs to a logical one resets the output register 44. Therefore, holding all inputs at a logical "1" state (except the input under test, which should be a logical "0") and clocking the device, the register 44 will load a logical "1". Then, by pulsing the input under test from a "0" to a "1", the T$_{pd}$ can be measured from input to AR of the output. By changing the polarity bit, P, T$_{phl}$ and T$_{plh}$ can be measured.

To test T$_{pd}$ AR from an I/O true path to an I/O, load the test configuration register is loaded as follows:

| BIT | VALUE | FUNCTION |
|---|---|---|
| 0 | "1" | Force true input path to logical one (I$_2$) |
| 1 | "1" | Force false input path to logical one (I$_2$) |
| 2 | "1" | Force output enable product terms to logical one (overridden by TB$_8$ for output I/O$_0$) |
| 3 | "1" | Force SUM-OF-PRODUCT terms to a logical one (SP will be disabled) |
| 4 | "0" | Enable feedback true path (I/O$_0$) |
| 5 | "1" | Force feedback false path to logical one (I/O$_0$) |
| 6 | "1" | Force feedback true path to logical one (I/O$_1$) |
| 7 | "1" | Force feedback false path to logical one (I/O$_1$) |
| 8 | "1" | Disable output I/O$_0$ |
| 9 | "0" | Enable output I/O$_1$ |
| 10 | X | Both polarities need to be tested |
| 11 | "0" | Registered outputs for T$_{pd}$ AR measurement |
| 12 | "1" | Force true path I$_1$ to logical one |
| 13 | "1" | Force false path I$_1$ to logical one |
| 14 | "0" | Enable AR product term |
| 15 | "1" | Force SP product term to logical zero |

In this configuration, forcing I/O$_0$ to a logical "1" state causes the output register 44 to reset. Therefore, holding I/O$_0$ at a logical "0" state and clocking the device, the register 44 will load a logical one. By then pulsing the input under test from a "0" to a "1", T$_{pd}$ AR can be measured from I/O$_0$ to I/O$_1$.

The foregoing circuitry and method of programmable testing for PAL's achieves more versatile and extensive testing than previously possible without programming the FAMOS cells in the logic array 22.

Although the present invention has been described in detail, it should be understood that various changes, substitutions and alterations can be made herein without departing from the spirit and scope or the invention as defined by the appended claims.

TABLE 1

| | TEST MODE CONFIGURATION REGISTER (4V2) | |
|---|---|---|
| BIT | LOGICAL ZERO | LOGICAL ONE |
| 0 | Normal Operation | Disable true input buffer I$_2$ |
| 1 | Normal Operation | Disable false input buffer I$_2$ |
| 2 | Normal Operation | Outputs always enabled (can be overridden by TB$_8$ or TB$_9$) |
| 3 | Normal Operation | SUM-OF-PRODUCT term always a logical one, unless SP is enabled, the SUM-OF-PRODUCT term always a logical "0". |
| 4 | Normal Operation | Disable true feedback buffer I/O$_0$ |

TABLE 1-continued

| | TEST MODE CONFIGURATION REGISTER (4V2) | |
|---|---|---|
| BIT | LOGICAL ZERO | LOGICAL ONE |
| 5 | Normal Operation | Disable false feedback buffer I/$O_0$ |
| 6 | Normal Operation | Disable true feedback buffer I/$O_1$ |
| 7 | Normal Operation | Disable false feedback buffer I/$O_1$ |
| 8 | Normal Operation | I/$O_0$ always disabled (will override $TB_2$) |
| 9 | Normal Operation | I/$O_1$ always disabled (will override $TB_2$) |
| 10 | Polarity active low | Polarity active high |
| 11 | Registered Outputs | Combinatorial outputs |
| 12 | Normal Operation | Disable true buffer $I_1$ |
| 13 | Normal Operation | Disable false buffer $I_1$ |
| 14 | Normal Operation | Disable asynchronous reset product term |
| 15 | Normal Operation | Disable synchronous preset product term |

What is claimed is:

1. Circuitry for synchronously or asynchronously testing the functions of a programmable logic device, said device including a plurality of elements responsive to logic signals and a plurality of input lines, said input lines forming a portion of a data flow path of said device when not in test mode, comprising:
   a test memory operable to receive, store and output a plurality of test configuration bits; and
   circuitry responsive to said test configuration bits for forcing said elements of the logic device into predetermined configurations while test signals are applied to at least one of said plurality of input lines.

2. The circuitry of claim 1 and further comprising a gate coupled to said memory and operable to output test configuration bits to said forcing circuitry responsive to a control signal applied to the logic device.

3. The circuitry of claim 1 wherein one of the elements comprises a true input buffer and wherein said forcing circuitry includes circuitry to disable the true input buffer of the logic device.

4. The circuitry of claim 1 wherein one of the elements comprises a false input buffer and wherein said forcing circuitry includes circuitry to disable the false input buffer of the logic device.

5. The circuitry of claim 1 wherein one of the elements comprises an output and wherein said forcing circuitry includes circuitry to enable the output of the logic device.

6. The circuitry of claim 1 wherein one of the elements comprises a sum-of-products term and wherein said forcing circuitry includes circuitry to force the logical state of the sum-of-product term of the logic device.

7. The circuitry of claim 1 wherein one of the elements comprises a feedback true buffer and wherein said forcing circuitry includes circuitry to disable the feedback true buffer of the logic device.

8. The circuitry of claim 1 wherein one of the elements comprises a feedback false buffer and wherein said forcing circuitry includes circuitry to disable the feedback false buffer of the logic device.

9. The circuitry of claim 1 wherein one of the elements comprises an input/output buffer and wherein said forcing circuitry includes circuitry to disable the input/output buffer of the logic device.

10. The circuitry of claim 1 wherein one of the elements comprises a polarity switch and wherein said forcing circuitry includes circuitry to set and clear the polarity switch of the logic device.

11. The circuitry of claim 1 wherein one of the elements comprises a registered/combinatorial switch and wherein said forcing circuitry includes circuitry to select registered and combinatorial output of the logic device.

12. The circuitry of claim 1 wherein one of the elements comprises an asynchronous reset product term and wherein said forcing circuitry includes circuitry to disable the asynchronous reset product term of the logic device.

13. The circuitry of claim 1 wherein one of the elements comprises a synchronous preset product term and wherein said forcing circuitry includes circuitry to disable the synchronous preset product term of the logic device.

14. A method for synchronously or asynchronously testing the functions of a programmable logic device, comprising the steps of:
   loading a test memory with test configuration bits;
   forcing a configuration of the logic device responsive to the signals at the outputs of said test memory; and
   applying a test signal to at least one input line of said device, wherein said input line forms a portion of a data flow path of said device when not in test mode.

15. The method of claim 14 and further comprising the step of applying an enabling signal to the test memory.

16. The method of claim 14 wherein said loading step comprises the step of serially inputting the test configuration bits into the test memory.

17. The method of claim 14 wherein said forcing step comprises the steps of:
   latching the test configuration bits in the memory;
   gating the test configuration bits at the outputs of the memory with a test gating signal; and
   applying the test configuration bits from the outputs of the memory to elements of the logic device.

18. The method of claim 17 wherein said applying step comprises the steps of:
   forcing elements of the logic device into logic conditions determined by the test configuration bits; and
   testing the functionality and performance of the resulting logical configuration.

19. The method of claim 18 wherein said testing step further comprises the steps of testing the sum-of-products terms of the logic device.

20. The method of claim 18 wherein said testing step comprises the step of measuring $T_{pd}$ from every input terminal of the logic device to every input/output terminal of the logic device.

21. The method of claim 18 wherein said testing step comprises the step of measuring $T_{su}$ and $T_{co}$ for every output of the logic device.

22. The method of claim 18 wherein said testing step comprises the step of measuring $T_{su}$ from every input terminal of the logic device to every input/output terminal of the logic device.

23. The method of claim 18 wherein said testing step comprises the step of measuring $T_{en}$ and $T_{dis}$ from every input terminal of the logic device to every input/output terminal of the logic device.

24. The method of claim 18 wherein said testing step comprises the step of measuring $T_{en}$ and $T_{dis}$ for every input/output terminal of the logic device to every other input/output terminal of the logic device.

25. The method of claim 18 wherein said testing step comprises the step of measuring $T_{pd}$ for asynchronous reset from every input terminal of the logic device to every input/output terminal of the logic device.

26. The method of claim 18 wherein said testing step comprises the step of measuring $T_{su}$ for synchronous preset from every input terminal of the logic device to every input/output terminal of the logic device.

27. A programmable logic device comprising:
 a plurality of elements responsive to logic signals;
 a plurality of input lines operable for inputting logic signals to said device, said plurality of input lines further operable for inputting test signals to said device, wherein said input lines form a portion of a data flow path of said device when not in test mode;
 a test memory operable to receive, store and output said test configuration bits; and
 circuitry responsive to said test configuration bits for forcing said elements of the logic device into predetermined configurations while said test signals are applied to said plurality of input lines.

28. The programmable logic device of claim 27 and further comprising a gate coupled to said test memory and operable to output test configuration bits to said configuring circuitry responsive to a control signal applied to the logic device.

29. The programmable logic device of claim 27 wherein one of the elements comprises a true input buffer and wherein said configuring circuitry includes circuitry to disable the true input buffer of the programmable logic device.

30. The programmable logic device of claim 27 wherein one of the elements comprises a false input buffer and wherein said configuring circuitry includes circuitry to disable the false input buffer of the programmable logic device.

31. The programmable logic device of claim 27 wherein one of the elements comprises an output and wherein said configuring circuitry includes circuitry to disable the output of the programmable logic device.

32. The programmable logic device of claim 27 wherein one of the elements comprises a sum-of-products term and wherein said configuring circuitry includes circuitry to force the logical state of the sum-of-products term of the programmable logic device.

33. The programmable logic device of claim 27 wherein one of the elements comprises feedback true buffer and wherein said configuring circuitry includes circuitry to disable the feedback true buffer of the programmable logic device.

34. The programmable logic device of claim 27 wherein one of the elements comprises feedback false buffer and wherein said configuring circuitry includes circuitry to disable the feedback false buffer of the programmable logic device.

35. The programmable logic device of claim 27 wherein one of the elements comprises an input/output buffer and wherein said configuring circuitry includes circuitry to disable the input/output buffer of the programmable logic device.

36. The programmable logic device of claim 27 wherein one of the elements comprises a polarity switch and wherein said configuring circuitry includes circuitry to disable the polarity switch of the programmable logic device.

37. The programmable logic device of claim 27 wherein one of the elements comprises a registered/combinatorial switch and wherein said configuring circuitry includes circuitry to force the state of the registered/combinatorial switch of the programmable logic device.

38. The programmable logic device of claim 27 wherein one of the elements comprises an asynchronous reset product term and wherein said configuring circuitry includes circuitry to disable the asynchronous reset product term of the programmable logic device.

39. The programmable logic device of claim 27 wherein one of the elements comprises a synchronous preset product term and wherein said configuring circuitry includes circuitry to disable the synchronous reset product term of the programmable logic device.

* * * * *